(12) United States Patent
Lu et al.

(10) Patent No.: US 7,339,199 B2
(45) Date of Patent: Mar. 4, 2008

(54) SEMICONDUCTOR PACKAGE INCLUDING LIGHT EMITTER AND IC

(75) Inventors: Wei Lung Lu, Taichung County (TW); Cheng Jen Liu, Tai-Ping (TW); Chin-Huang Chang, Tai-Ping (TW); Yi-Feng Chang, Taichung (TW)

(73) Assignee: Siliconware Precision Industries Co., Ltd., Tantzu Taichung (TW)

( * ) Notice: Subject to any disclaimer, the term of this patent is extended or adjusted under 35 U.S.C. 154(b) by 33 days.

(21) Appl. No.: 11/237,137

(22) Filed: Sep. 28, 2005

(65) Prior Publication Data
US 2006/0071220 A1 Apr. 6, 2006

(30) Foreign Application Priority Data
Oct. 6, 2004 (TW) .............................. 93130262 A

(51) Int. Cl.
*H01L 29/22* (2006.01)
(52) U.S. Cl. .............................. 257/98; 257/99; 257/79
(58) Field of Classification Search ................ 257/98, 257/99, 100, 80, 82, 88; 438/22, 26, 29, 438/116
See application file for complete search history.

(56) References Cited

U.S. PATENT DOCUMENTS

| | | | |
|---|---|---|---|
| 5,250,816 A * | 10/1993 | Kitamura | 257/81 |
| 6,525,386 B1 * | 2/2003 | Mills et al. | 257/433 |
| 6,611,434 B1 | 8/2003 | Lo et al. | |
| 6,642,735 B2 | 11/2003 | Chiang et al. | |
| 6,803,607 B1 * | 10/2004 | Chan et al. | 257/98 |
| 7,049,632 B2 * | 5/2006 | Gemar et al. | 257/48 |
| 2003/0194831 A1 * | 10/2003 | Ng et al. | 438/106 |
| 2005/0218421 A1 * | 10/2005 | Andrews et al. | 257/100 |
| 2006/0270105 A1 * | 11/2006 | Takiar et al. | 438/106 |

* cited by examiner

*Primary Examiner*—Zandra V. Smith
*Assistant Examiner*—Paul E Patton
(74) *Attorney, Agent, or Firm*—Thomas, Kayden, Horstemeyer & Risley

(57) ABSTRACT

The is to disclose a semiconductor package featuring inclusion of light emitter(s) providing light to indicate the states of the semiconductor package as a whole and/or the chip(s) therein. The light emitter is in an original state or flashing state or emitting state according to the states of the semiconductor package as a whole and/or the chip(s). The semiconductor package includes a carrier and a shield structure in addition to the light emitter. The chip and at least part of the carrier are covered by the shield structure. The light emitter may be partially or fully covered or sealed by the shield structure. The light emitter may also be partially or fully exposed. The shield structure is such that the light provided by the light emitter sealed therein can pass therethrough to reach the outside thereof, thereby the states of the semiconductor package as a whole and/or the chip(s) can be recognized from the outside of the semiconductor package.

20 Claims, 3 Drawing Sheets

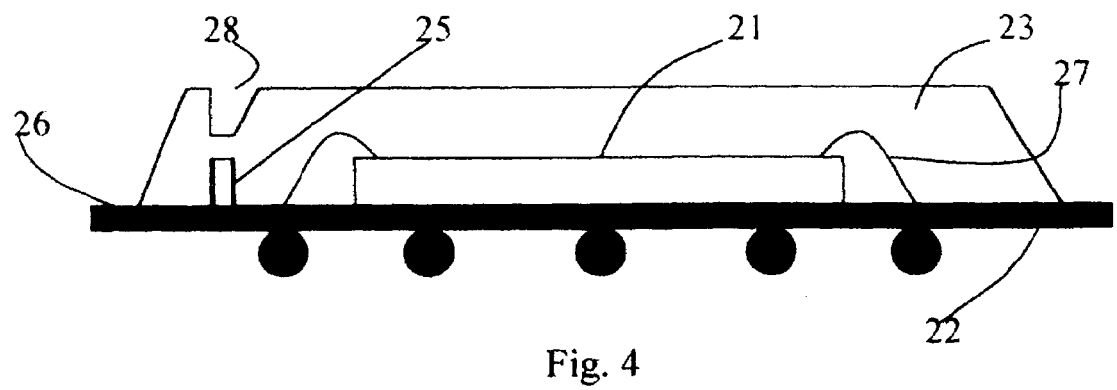
Fig. 4
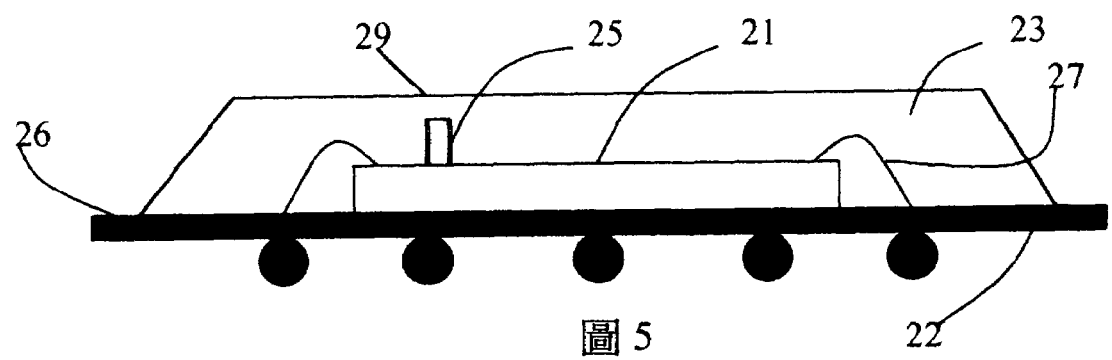
圖 5
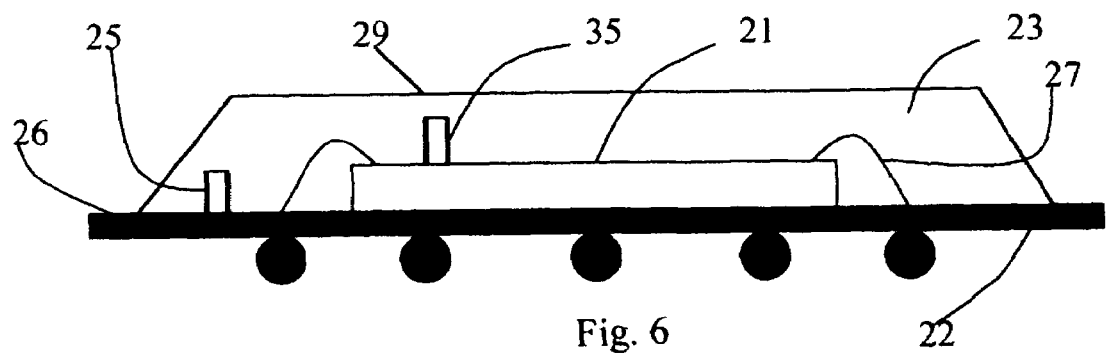
Fig. 6

SEMICONDUCTOR PACKAGE INCLUDING LIGHT EMITTER AND IC

FIELD OF THE INVENTION

The present invention relates to a semiconductor package including at least a light emitter, and particularly to a semiconductor package including at least a light emitter to indicate the states of the package and/or the states of the components in the package.

BACKGROUND OF THE INVENTION

A typical BGA (Ball Grid Array) package according to conventional arts, such as U.S. Pat. No. 5,216,278 shown in FIG. 1, comprises chip 1, substrate 2, and encapsulant 3, wherein chip 1 connects substrate 2 via bonding wire 4, encapsulant 3 covers chip 1, bonding wire 4, and the connection surface of substrate 2. All typical semiconductor packages according to conventional arts include chips, substrates, and encapsulants, except a light emitter. Almost all modern BGA packages, such as the one disclosed in U.S. Pat. No. 6,611,434, have a large number of components packed therein, not only stacked multi-chips, but also many passive elements for improving electrical characteristics and/or performance. In case there is an occurrence of failure or abnormality with such a package, delicate processes with extreme complexity are requisite for diagnosis. U.S. Pat. No. 6,642,735 provides a scheme to detect the state of a semiconductor package, by which the abnormality or failure of the semiconductor package is recognized through measuring some exposed pins thereof configured for the purpose of diagnosis. The scheme provided by U.S. Pat. No. 6,642,735, however, necessitate instruments for doing a sequence of measurements. If at least a light emitter is included in a semiconductor package to indicate the states of the semiconductor package as a whole or the states of the components (IC or the other electronic parts) therein, the information regarding the states (such as normality/failure) of the semiconductor package can be easily obtained, and the source of failure or abnormality can be easily recognized whenever a circuit board (such as a computer main board or any one having multiple semiconductor packages thereon) becomes out of order. In addition, a circuit board with failure or abnormality can be assigned to different repair levels according to what is indicated by the light emitter included in the semiconductor package, and instruments are not always necessary, resulting in significant simplification of the repair process/management for either the circuit board or the semiconductor package including such a light emitter or light emitters.

SUMMARY OF THE INVENTION

An object of the present invention is to provide a semiconductor package including light emitter, for simplifying the repair process of a circuit board having semiconductor packages and another components thereon.

Another object of the present invention is to provide a semiconductor package including light emitter, for simplify the repair process of the semiconductor package.

A further object of the present invention is to provide a semiconductor package including light emitter, for related industries to easily diagnose the source of failure or abnormality when a circuit board including such a semiconductor package is out of order.

Another further object of the present invention is to provide a semiconductor package including light emitter, for related industries to classify, according to what is indicated by the light emitter, the repair level of a circuit board including such a semiconductor package, whenever there is an occurrence of failure or abnormality.

An even further object of the present invention is to provide a semiconductor package including light emitter, for related industries to recognize the state (such as failure or normality) of the semiconductor package without need of instruments.

The "chip" according to the disclosure means a semiconductor unit (dice or wafer in addition to chip) including an IC.

The semiconductor package provided by the present invention comprises:

a carrier such as a substrate or any object suitable for supporting or connecting electronic components;

at least a chip attached to the carrier via adhesive or the other connection means;

at least a light emitter such as LED (light emitting diode) or any component capable of providing light in response to the electrical power or signal applied thereto, the light emitter electrically connecting the chip, and being in an original state (no input power or no input signal or no output, for example), or in a flashing state providing flashing light, or in an emitting state providing light; and a shield structure such as mold compound or encapsulant, or any structure suitable for suppressing moisture penetration, or providing electrical insulation to a certain extent, or receiving pressure of a certain magnitude, the shield structure covering the chip, the light emitter, and at least part of the carrier (i.e., part or all of the carrier), and being such that at least part of the light provided by the light emitter pass therethrough to reach the outside thereof, i.e., part or all of the light provided by the light emitter (whenever in the flashing state or emitting state) propagates through the shield structure to be sensed or observed from the outside of the semiconductor package.

The light emitter according to the present invention may be used for indicating the states of the chip, such as operating state, power off state, normally operating state, abnormally operating state, state of receiving signal, or state of outputting signal, etc. The light emitter according to the present invention may also be used for indicating the states of the entire semiconductor package, such as operating state, power off state, state of presence of input/output signal, state of occurrence of short-circuit between electronic parts, or state of occurrence of open-circuit of connection means, etc.

The semiconductor package according to the present invention may also be so configured that the light emitter is in the original state or flashing state or emitting state according to different states of at least a signal (such as input signal, or output signal, or state indicating signal, etc) associated with the chip, with the original state, the flashing state, and the emitting state respectively correspond to different states of a signal associated with the chip.

The light provided by the light emitter according to the present invention is preferably visible light (i.e., the light with wave length to which human eyes are sensitive).

The shield structure according to the present invention may be configured to seal or cover the chip, at least part of the carrier, and part of the light emitter, while let the other part of the light emitter exposed (i.e., exposed to the outside of the shield structure/semiconductor package), thereby the state (original or flashing or emitting) of the light emitter can be recognized or observed from the outside of the semiconductor package.

The shield structure according to the present invention may also be configured to include a portion for visible light (or the light provided by the light emitter) to pass therethrough to reach the outside of the shield structure (i.e., to propagate from the light emitter to the outside of the semiconductor package). If the shield structure according to present invention is made of transparent material or material allowing the light provided by the light emitter to propagate therethrough, the state (original, or flashing, or emitting) of the light emitter can be recognized from the outside of the semiconductor package regardless of the location of the light emitter.

The semiconductor package according to the present invention may be alternatively so configured that the light emitter is located outside of the shield structure, and electrically connected with the chip, with the shield structure covering the chip and part of the carrier, but letting the light emitter fully exposed, thereby the state (original, or flashing, or emitting) of the light emitter can be directly recognized from the outside of the semiconductor package.

An example of forming the electrical connection between the light emitter and the chip is via a conducting trace on a surface of the carrier.

The semiconductor package according to the present invention may also be alternatively configured in such a way that the light emitter directly connects at least one pad of the chip to form its electrical connection with the chip, the shield structure covers the chip and at least part of the carrier, but let part or all of the light emitter exposed to the outside of the shield structure, thereby the state (original, or flashing, or emitting) of the light emitter can be directly recognized from the outside of the semiconductor package.

The present invention may best be understood through the following description with reference to the accompanying drawings, in which:

BRIEF DESCRIPTION OF THE DRAWINGS

FIGS. 2-9 show side views of various embodiments provided according to the present invention.

DETAILED DESCRIPTION OF THE PREFERRED EMBODIMENTS

Figure 1:
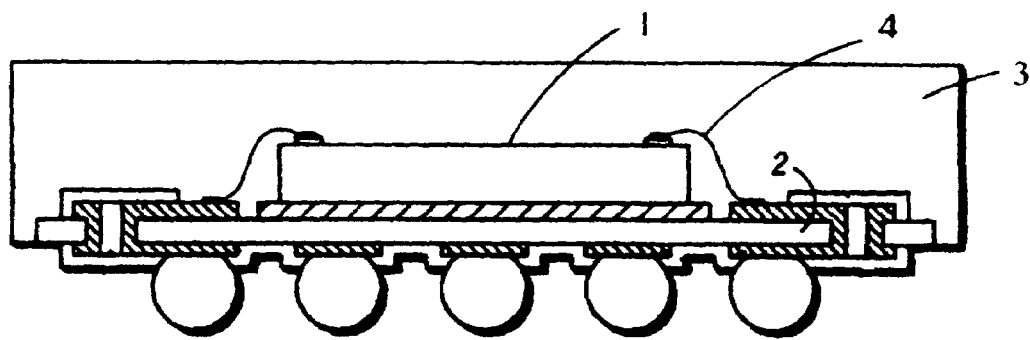
FIG. 1 shows a side view of a typical semiconductor package representing conventional arts.
Figure 2:
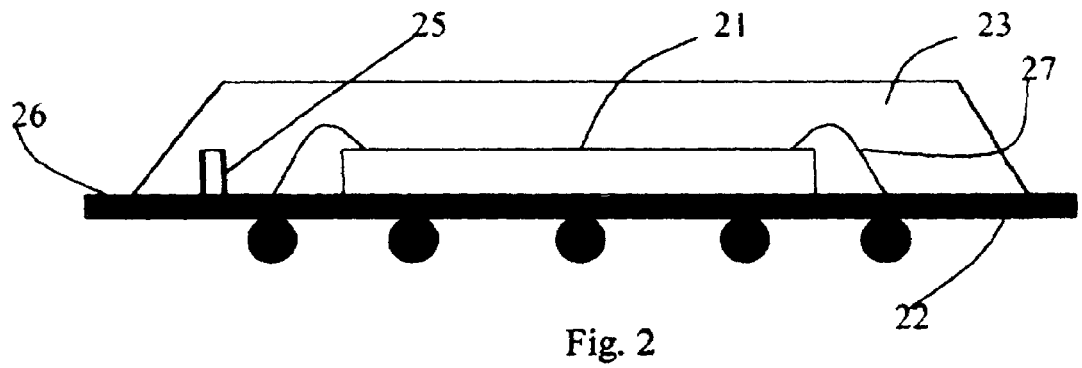

As shown in FIG. 2, an embodiment representing a first aspect of the semiconductor package according to the present invention comprises: a carrier 22; at least a chip 21 attached to the carrier 22; at least a light emitter 25 electrically connecting the chip 21, and being in an original state, or a flashing state providing flashing light, or an emitting state providing light; and a shield structure 23 covering the chip 21, the light emitter 25, and at least part of the carrier 22, and being such that at least part of the light provided by the light emitter 25 pass therethrough to reach the outside thereof, i.e., part or all of the light provided by the light emitter 25 propagates through the shield structure 23 to reach the outside of the shield structure 23, i.e., to reach the outside of the semiconductor package.

As shown in FIG. 2, chip 21 connects carrier 22 via a surface 26 of the carrier 22, and light emitter 25 also connects carrier 22 via surface 26 (via traces on surface 26 for example) of the carrier 22. Light emitter 25, chip 21, and at least part of surface 26 of carrier 22, are covered (or sealed) by shield structure 23. A semiconductor package according to the present invention may further comprise, for example, connection lines 27 (such as bonding wires) for electrically connecting chip 21 and carrier 22, via bonding fingers (not shown in the figure) of carrier 22. Connection lines 27 and/or bonding fingers may also be covered by shield structure 23.

Figure 3:
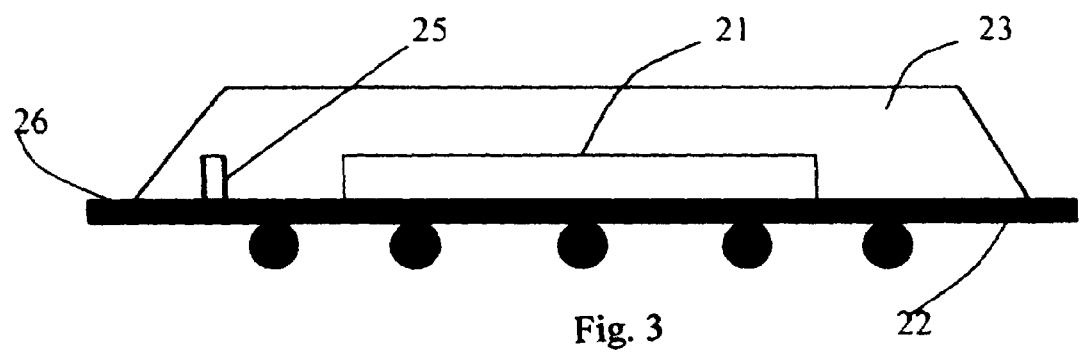

Shown in FIG. 3 is an embodiment representing a second aspect of the semiconductor package according to the present invention. FIG. 3 is different from FIG. 2 in that the chip 21 is a flip chip, and bumps (not shown in the figure) instead of bonding wires 27 are used to connect chip 21 and carrier 22, with bumps located between chip 21 and the surface 26 of carrier 22.

Shown in FIG. 4 is an embodiment representing a third aspect of the semiconductor package according to the present invention. FIG. 4 is different from FIG. 2 in that the shield structure 23 includes a cavity 28 sinking toward the light emitter 25 from the outside of the shield structure 23, resulting in a shorter distance (eg, no more than 10 mils, or less than 0.01 inches) between light emitter 25 and the outside of the shield structure 23, for the light provided by light emitter 25 to reach the outside of the shield structure 23, thereby the state (original or flashing or emitting) of light emitter can be easier recognized from the outside of the semiconductor package.

Shown in FIG. 5 is an embodiment representing a fourth aspect of the semiconductor package according to the present invention. In FIG. 5, chip 21 lies between light emitter 25 and carrier 22. Chip 21, light emitter 25, and at least part of surface 26 of carrier 22 are covered (or sealed) by shield structure 23, and light emitter 25 is located between chip 21 and a part 29 of shield structure 23.

Shown in FIG. 6 is an embodiment representing a fifth aspect of the semiconductor package according to the present invention. In FIG. 6, both light emitter 25 and chip 21 connect surface 26 of carrier 22, another light emitter 35 is located between chip 21 and part 29 of shield structure 23; chip 21, light emitter 25, light emitter 35, and at least part of surface 26 of carrier 22 are covered or sealed by shield structure 23.

Figure 7:
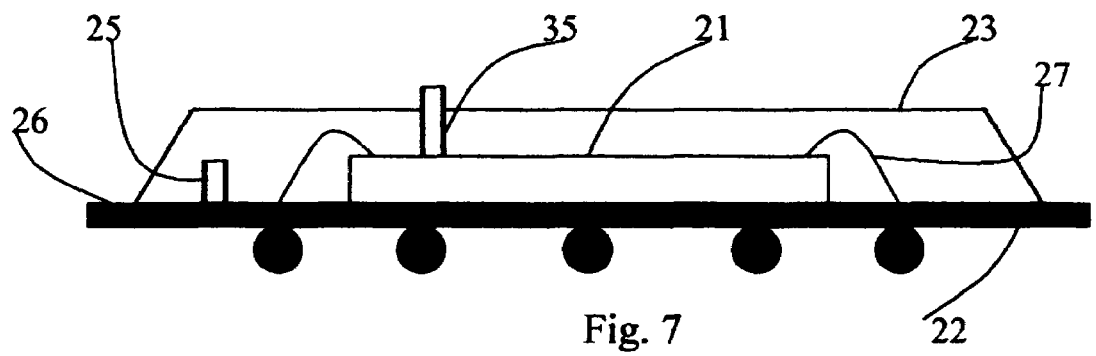

Shown in FIG. 7 is an embodiment representing a sixth aspect of the semiconductor package according to the present invention. In FIG. 7, both light emitter 25 and chip 21 connects surface 26 of carrier 22, chip 21 lies between another light emitter 35 and carrier 22; chip 21, light emitter 25, a part of light emitter 35, and at least part of surface 26 of carrier 22, are covered or sealed by shield structure 23, while another part of light emitter 35 is exposed to the outside of shield structure 23.

Figure 8:
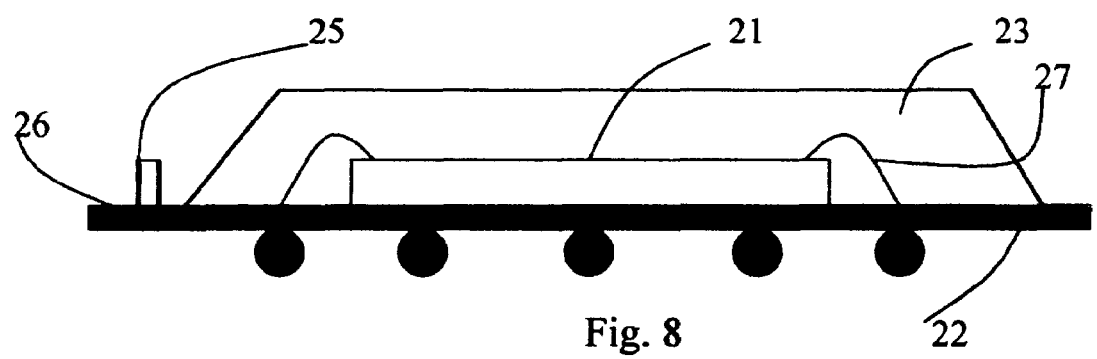

Shown in FIG. 8 is an embodiment representing a seventh aspect of the semiconductor package according to the present invention. In FIG. 8, both light emitter 25 and chip 21 connects surface 26 of carrier 22; chip 21 and at least part of surface 26 of carrier 22 are covered or sealed by shield structure 23, while light emitter 25 is fully exposed to the outside of shield structure 23.

Figure 9:
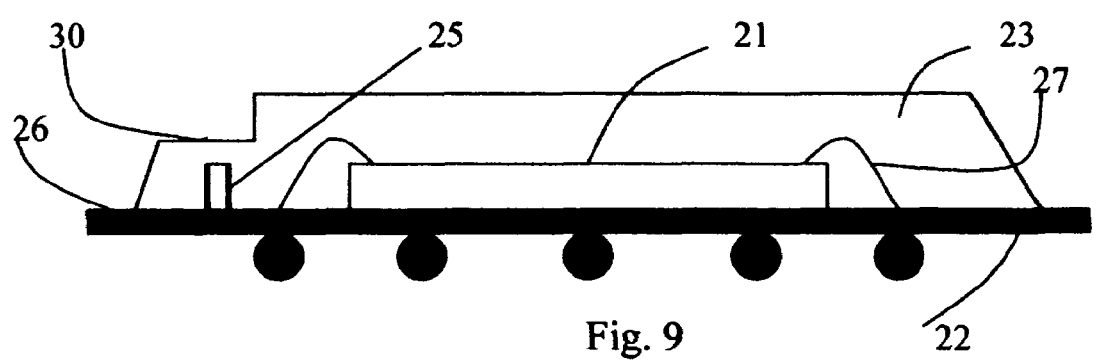

Shown in FIG. 9 is an embodiment representing an eighth aspect of the semiconductor package according to the present invention. In FIG. 9, shield structure 23 includes a thin portion 30 adjacent to light emitter 25, and is configured to be such that the distance from light emitter 25 to the outside of shield structure 23 via the thin portion 30 is shorter (eg, less than 10 mils), for the light provided by light emitter 25 to reach the outside of shield structure 23, thereby the state of light emitter 25 can be easier recognized from the outside of the semiconductor package.

In any semiconductor package embodied according to the present invention, either represented by FIGS. 2-9 above or representing the other aspects based on the spirit and/or scope of the present invention, light emitter 25 and/or light emitter 35 may electrically connect the input and/or output and/or state indication pin(s) of chip 21, thereby the states of chip 21 can be recognized from the outside of the semiconductor package provided according to the present invention. Likewise, any semiconductor package embodied according to the present invention may be configured to be such that light emitter 25 and/or light emitter 35 connect certain points of carrier 22 and/or certain pins of chip 21, thereby the states of the semiconductor package as a whole and/or the chip(s) therein can be recognized by observing the state of light emitter 25 and/or light emitter 35 from the outside of the semiconductor package.

In any semiconductor package embodied according to the present invention, either represented by FIGS. 2-9 above or representing the other aspects based on the spirit and/or scope of the present invention, adhesive (not shown in the figure) may be used to connect or attach chip 21 to carrier 22, and to connect or attach light emitter 25 to carrier 22 and/or chip 21. Likewise, adhesive may be used to connect or attach light emitter 35 to carrier 22 and/or chip 21.

In case the shield structure 23 according to the present invention is made of transparent material, or made of material allowing the light provided by light emitter 25 and light emitter 35 to propagate therethrough, the light provided by the light emitters can reach the outside of the semiconductor package regardless of the location of the light emitters, and irrespective of the shape of shield structure 23.

While the invention has been described in terms of what are presently considered to be the most practical or preferred embodiments, it shall be understood that the invention is not limited to the disclosed embodiment. On the contrary, any modifications or similar arrangements shall be deemed covered by the spirit of the present invention.

What is claimed is:

1. A semiconductor package comprising:
   a carrier;
   at least a chip attached to said carrier;
   at least a light emitter electrically connecting said chip, and being in one of the states including original state, flashing state, and emitting state, for indicating the states of said semiconductor package, the states of said semiconductor package including at least two among operating state of said chip, power off state of said chip, normally operating state of said chip, and abnormally operating state of said chip; and
   a shield structure covering said chip, said light emitter, and at least part of said carrier, for providing at least one of the functions including suppression of moisture penetration, electrical insulation, and receiving of pressure, said shield structure being such that at least part of the light provided by said light emitter pass therethrough to reach the outside thereof.

2. The semiconductor package according to claim 1 wherein said carrier includes a first surface, said chip is attached to the first surface of said carrier, said chip, said light emitter, and at least part of said first surface are covered by said shield structure.

3. The semiconductor package according to claim 2 wherein said light emitter connects the first surface of said carrier.

4. The semiconductor package according to claim 1 further comprising a connection unit for electrically connecting said light emitter to said chip, said connection unit being covered by said shield structure.

5. The semiconductor package according to claim 1 wherein said shield structure includes a cavity sinking toward said light emitter from the outside of said shield structure.

6. The semiconductor package according to claim 5 wherein the maximum distance from said light emitter to the outside of said shield structure is 10 mils.

7. The semiconductor package according to claim 1 comprising a second light emitter for indicating the states of said semiconductor package, the states of said semiconductor package including at least two among operating state of said semiconductor package, power off state of said semiconductor package, state of occurrence of short-circuit in said semiconductor package, and state of occurrence of open-circuit in said semiconductor package.

8. The semiconductor package according to claim 1 wherein said chip lies between said light emitter and said carrier.

9. The semiconductor package according to claim 1 wherein said light emitter lies between said chip and part of said shield structure.

10. The semiconductor package according to claim 1 wherein said chip includes an integrated circuit.

11. The semiconductor package according to claim 1 wherein said light emitter is further for indicating the states of said semiconductor package, the states of said semiconductor package including at least two among operating state of said semiconductor package, power off state of said semiconductor package, state of occurrence of short-circuit in said semiconductor package, and state of occurrence of open-circuit in said semiconductor package.

12. The semiconductor package according to claim 1 further comprising an adhesive for connecting said chip to said carrier and connecting said light emitter to at least one of said carrier and said chip.

13. A semiconductor package comprising:
   a carrier;
   at least a chip attached to said carrier;
   at least a light emitter electrically connecting said chip, and being in one of the states including original state, flashing state, and emitting state, for indicating the states of said semiconductor package, the states of said semiconductor package including at least two among operating state of said chip, power off state of said chip, normally operating state of said chip, and abnormally operating state of said chip; and
   a shield structure covering said chip, a first part of said light emitter, and at least part of said carrier, a second part of said light emitter being exposed to the outside of said shield structure.

14. The semiconductor package according to claim 13 wherein said light emitter is further for indicating the states of said semiconductor package, the states of said semiconductor package including at least two among operating state of said semiconductor package, power off state of said semiconductor package, state of occurrence of short-circuit in said semiconductor package, and state of occurrence of open-circuit in said semiconductor package.

15. The semiconductor package according to claim 13 wherein said light emitter is such that said original state, said flashing state, and said emitting state, respectively correspond to different states of said semiconductor package.

16. The semiconductor package according to claim 13 comprising a second light emitter for indicating the states of said semiconductor package, the states of said semiconductor package including at least two among operating state of said semiconductor package, power off state of said semiconductor package, state of occurrence of short-circuit in said semiconductor package, and state of occurrence of open-circuit in said semiconductor package.

17. A semiconductor package comprising:

a carrier;

at least a chip attached to said carrier;

at least a light emitter electrically connecting said chip, and being in one of the states including original state, flashing state, and emitting state; and a shield structure covering said chip, said light emitter, and at least part of said carrier, and including a thin portion which is between said light emitter and the outside of said shield structure, and provides a light path between said light emitter and the outside of said shield structure, for the light provided by said light emitter to pass therethrough to reach the outside of said shield structure.

18. The semiconductor package according to claim 17 wherein the thickness of said thin portion is at most 10 mils, and said light emitter is for indicating the states of said semiconductor package, the states of said semiconductor package including at least two among operating state of said chip, power off state of said chip, normally operating state of said chip, abnormally operating state of said chip, operating state of said semiconductor package, power off state of said semiconductor package, state of occurrence of short-circuit in said semiconductor package, and state of occurrence of open-circuit in said semiconductor package.

19. A semiconductor package comprising:

a carrier;

at least an chip attached to said carrier;

at least a light emitter electrically connecting said chip, and being in one of the states including original state, flashing state, and emitting state, for indicating the states of said semiconductor package, the states of said semiconductor package including at least two among operating state of said chip, power off state of said chip, normally operating state of said chip, abnormally operating state of said chip, operating state of said semiconductor package, power off state of said semiconductor package, state of occurrence of short-circuit in said semiconductor package, and state of occurrence of open-circuit in said semiconductor package; and a shield structure covering said chip, said light emitter, and at least part of said carrier, for providing at least one of the functions including suppression of moisture penetration, electrical insulation, and receiving of pressure, said shield structure allowing the light provided by said light emitter to propagate therethrough.

20. A semiconductor package comprising:

a carrier;

at least an chip attached to said carrier;

at least a light emitter electrically connecting said chip, and being in one of the states including original state, flashing state and emitting state, for indicating the states of said semiconductor package, the states of said semiconductor package including at least two among operating state of said chip, power off state of said chip, normally operating state of said chip, abnormally operating state of said chip, operating state of said semiconductor package, power off state of said semiconductor package, state of occurrence of short-circuit in said semiconductor package, and state of occurrence of open-circuit in said semiconductor package; and a shield structure covering said chip, and at least part of said carrier.

* * * * *